United States Patent
Azizi et al.

(10) Patent No.: US 12,199,585 B2
(45) Date of Patent: Jan. 14, 2025

(54) BALUNS WITH INTEGRATED MATCHING NETWORKS

(71) Applicant: Skyworks Solutions, Inc., Irvine, CA (US)

(72) Inventors: Mostafa Azizi, Stittsville (CA); Mehdi Naseri Ali Abadi, Stittsville (CA); Hassan Sarbishaei, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 462 days.

(21) Appl. No.: 17/455,091

(22) Filed: Nov. 16, 2021

(65) Prior Publication Data
US 2022/0190803 A1    Jun. 16, 2022

Related U.S. Application Data

(60) Provisional application No. 63/199,153, filed on Dec. 10, 2020.

(51) Int. Cl.
 *H03H 7/42*     (2006.01)
 *H03H 7/38*     (2006.01)

(52) U.S. Cl.
 CPC ............... *H03H 7/38* (2013.01); *H03H 7/42* (2013.01)

(58) Field of Classification Search
 CPC .. H03H 7/42; H03H 7/422; H01P 5/12; H01P 5/185; H01P 5/187
 See application file for complete search history.

(56) References Cited

U.S. PATENT DOCUMENTS

| 3,469,194 A | 9/1969 | Osborn |
| 3,479,587 A | 11/1969 | MacKenzie |
| 4,924,236 A | 5/1990 | Schuss et al. |

(Continued)

FOREIGN PATENT DOCUMENTS

| EP | 2814113 | 12/2014 |
| EP | 3145077 | 3/2017 |

(Continued)

OTHER PUBLICATIONS

Johansen et al., "Analysis and design of lumped element marchand baluns", International Conference on Microwaves, Radar and Wireless Communications, pp. 1-4 (2008).

(Continued)

*Primary Examiner* — Stephen E. Jones
(74) *Attorney, Agent, or Firm* — Knobbe, Martens, Olson & Bear, LLP

(57) ABSTRACT

Baluns with integrated matching networks are provided herein. In certain embodiments, a balun structure includes a first pair of coupled lines, a second pair of coupled lines and a transmission line. Additionally, a first port of the balun is connected to a reference voltage by way of a first line of the first pair of coupled lines, the transmission line, and a first line of the second pair of coupled lines. Furthermore, a second port of the balun is connected to the reference voltage by way of a second line of the first pair of coupled lines, while a third port of the balun is connected to the reference voltage by way of a second line of the second pair of coupled lines. The first port serves as an unbalanced signal terminal, while the second port and the third port serve as positive and negative signal terminals.

20 Claims, 11 Drawing Sheets

(56) References Cited

U.S. PATENT DOCUMENTS

| | | |
|---|---|---|
| 4,952,895 A | 8/1990 | Quan |
| 4,956,582 A | 9/1990 | Bourassa |
| 5,144,206 A | 9/1992 | Butler et al. |
| 5,274,391 A | 12/1993 | Connolly |
| 5,379,006 A | 1/1995 | McCorkle |
| 5,412,355 A | 5/1995 | Lee |
| 5,484,985 A | 1/1996 | Edelstein et al. |
| 5,635,945 A | 6/1997 | McConnell et al. |
| 6,147,653 A | 11/2000 | Wallace et al. |
| 6,307,524 B1 | 10/2001 | Britain |
| 6,384,798 B1 | 5/2002 | Barta et al. |
| 6,411,264 B1 | 6/2002 | Gustafson |
| 6,452,462 B2 | 9/2002 | Lo |
| 6,922,108 B2 | 7/2005 | Lin |
| 6,940,462 B2 | 9/2005 | Packer |
| 6,959,180 B2 | 10/2005 | Ji |
| 7,023,909 B1 | 4/2006 | Adams et al. |
| 7,825,746 B2 | 11/2010 | Yeung et al. |
| 8,058,948 B2 | 11/2011 | Rijssemus |
| 8,138,853 B2 | 3/2012 | Chu |
| 8,306,494 B2 | 11/2012 | Ojo |
| 8,547,185 B2 | 10/2013 | Soman |
| 8,547,291 B1 | 10/2013 | Josypenko |
| 8,558,754 B2 | 10/2013 | Drake et al. |
| 8,896,373 B2 | 11/2014 | Mei |
| 8,988,295 B2 | 3/2015 | Swais et al. |
| 9,331,664 B2 | 5/2016 | Bouisse et al. |
| 9,397,720 B2 | 7/2016 | Jerng et al. |
| 9,865,934 B2 | 1/2018 | Sertel et al. |
| 9,866,196 B2 | 1/2018 | Gorbachov |
| 9,885,765 B2 | 2/2018 | Zeng et al. |
| 10,014,573 B2 | 7/2018 | Peterson et al. |
| 10,236,841 B2 | 3/2019 | Xu et al. |
| 10,566,946 B2 | 2/2020 | Gorbachov |
| 10,903,544 B2 | 1/2021 | Chakraborty et al. |
| 10,941,053 B2 | 3/2021 | Do et al. |
| 11,069,476 B2 | 7/2021 | Chayat et al. |
| 2002/0171529 A1 | 11/2002 | Tang |
| 2003/0001710 A1 | 1/2003 | Tang et al. |
| 2005/0208901 A1* | 9/2005 | Chiu .................. H04B 1/18 455/73 |
| 2010/0026412 A1 | 2/2010 | Kirkeby |
| 2016/0308495 A1 | 10/2016 | Canning et al. |
| 2021/0151848 A1 | 5/2021 | Chakraborty et al. |
| 2021/0336326 A1 | 10/2021 | Venkatasubramanian et al. |

FOREIGN PATENT DOCUMENTS

| | | |
|---|---|---|
| JP | 2010-199894 | 9/2010 |
| WO | WO 2002/052590 | 7/2002 |
| WO | WO 2008/071472 | 6/2008 |

OTHER PUBLICATIONS

Tsai et al., "Broadband balanced frequency doublers with fundamental rejection enhancement using a novel compensated marchand balun", IEEE Transactions on Microwave Theory and Techniques, vol. 61(5):1913-1923 (2013).

Zhang et al., "A complex impedance-transforming coupled-line balun", Progress in Electromagnetics Research Letters, vol. 48:123-128 (2014).

\* cited by examiner

BALUNS WITH INTEGRATED MATCHING NETWORKS

CROSS-REFERENCE TO RELATED APPLICATIONS

This application claims the benefit of priority under 35 U.S.C. § 119 of U.S. Provisional Patent Application No. 63/199,153, filed Dec. 10, 2020 and titled "BALUNS WITH INTEGRATED MATCHING NETWORKS," which is herein incorporated by reference in its entirety.

BACKGROUND

Technical Field

Embodiments of the invention relate to electronic systems, and in particular, to radio frequency (RF) electronics.

Description of Related Technology

A balun can be used to convert a single-ended RF signal to a differential RF signal, or vice versa. Examples of RF communication systems with one or more baluns include, but are not limited to, mobile phones, tablets, base stations, network access points, customer-premises equipment (CPE), laptops, and wearable electronics.

Baluns can be included in RF communication systems to provide conversion of RF signals of a wide range of frequencies. For example, baluns can handle RF signals in a frequency range of about 30 kHz to 300 GHz, such as in the range of about 410 MHz to about 7.125 GHz for fifth generation (5G) communications using Frequency Range 1 (FR1) or in the range of about 24.25 GHz to 52.6 GHz for 5G communications using Frequency Range 2 (FR2).

SUMMARY

In certain embodiments, the present disclosure relates to a balun. The balun includes a first pair of coupled lines including a first conductive line and a second conductive line, a second pair of coupled lines including a third conductive line and a fourth conductive line, and a transmission line connecting the first conductive line of the first pair of coupled lines to the third conductive line of the second pair of conductive lines.

In several embodiments, the first pair of conductive lines and the second pair of conductive lines have different lengths.

In various embodiments, the first pair of conductive lines and the second pair of conductive lines have different odd-mode impedances.

In some embodiments, the first pair of conductive lines and the second pair of conductive lines have different even-mode impedances.

In several embodiments, the first pair of conductive lines, the second pair of conductive lines, and the transmission line are implemented to provide input matching.

In various embodiments, the first pair of conductive lines, the second pair of conductive lines, and the transmission line are implemented to provide output matching.

In a number of embodiments, the transmission line includes a coil.

In some embodiments, the balun further includes a first port connected to an end of the first conductive line opposite the transmission line, a second port connected to the second conductive line of the first pair of conductive lines, and a third port connected to the fourth conductive line of the second pair of conductive lines.

According to a number of embodiments, the first port is as an unbalanced terminal for a single-ended signal, the second port is as a positive terminal for a differential signal, and the third port is as a negative terminal for the differential signal.

In accordance with several embodiments, an end of the third conductive line opposite the transmission line is connected to a reference voltage.

According to various embodiments, an end of the second conductive line opposite the second port is connected to a reference voltage.

In accordance with a number of embodiments, an end of the fourth conductive line opposite the third port is connected to a reference voltage.

According to a number of embodiments, the first port is configured to receive a single-ended signal from an amplifier.

In accordance with several embodiments, the first port is configured to output a single-ended signal to an amplifier.

According to various embodiments, the second port and the third port are configured to receive a differential signal from an amplifier.

In accordance with a number of embodiments, the second port and the third port are configured to provide a differential signal to an amplifier.

In certain embodiments, the present disclosure relates to a wireless device. The wireless device includes a transceiver and a front-end system coupled to the transceiver. The front-end system includes a balun that includes a first pair of coupled lines including a first conductive line and a second conductive line, a second pair of coupled lines including a third conductive line and a fourth conductive line, and a transmission line connecting the first conductive line of the first pair of coupled lines to the third conductive line of the second pair of conductive lines.

In various embodiments, the first pair of conductive lines and the second pair of conductive lines have different lengths.

In several embodiments, the first pair of conductive lines and the second pair of conductive lines have different odd-mode impedances.

In a number of embodiments, the first pair of conductive lines and the second pair of conductive lines have different even-mode impedances.

In some embodiments, the first pair of conductive lines, the second pair of conductive lines, and the transmission line are implemented to provide input matching.

In various embodiments, the first pair of conductive lines, the second pair of conductive lines, and the transmission line are implemented to provide output matching.

In several embodiments, the transmission line includes a coil.

In some embodiments, the balun further includes a first port connected to an end of the first conductive line opposite the transmission line, a second port connected to the second conductive line of the first pair of conductive lines, and a third port connected to the fourth conductive line of the second pair of conductive lines.

According to a number of embodiments, the first port is an unbalanced terminal for a single-ended signal, the second port is a positive terminal for a differential signal, and the third port is a negative terminal for the differential signal.

In accordance with several embodiments, an end of the third conductive line opposite the transmission line is connected to a reference voltage.

According to various embodiments, an end of the second conductive line opposite the second port is connected to a reference voltage.

In accordance with a number of embodiments, an end of the fourth conductive line opposite the third port is connected to a reference voltage.

According to various embodiments, the front end system further includes an amplifier configured to receive a single-ended signal from the first port.

In accordance with several embodiments, the front end system further includes an amplifier configured to provide a single-ended signal to the first port.

According to a number of embodiments, the front end system further includes an amplifier configured to receive a differential signal from the second port and the third port.

In accordance with several embodiments, the front end system further includes an amplifier configured to provide a differential signal to the second port and the third port.

In certain embodiments, the present disclosure relates to a method of signal conversion in a balun. The method includes providing coupling between a first conductive line and a second conductive line of a first pair of coupled lines, providing coupling between a third conductive line and a fourth conductive line of a second pair of coupled lines, and using a transmission line to provide a signal path from the first conductive line of the first pair of coupled lines to the third conductive line of the second pair of conductive lines.

In various embodiments, the first pair of conductive lines and the second pair of conductive lines have different lengths.

In several embodiments, the first pair of conductive lines and the second pair of conductive lines have different odd-mode impedances.

In a number of embodiments, the first pair of conductive lines and the second pair of conductive lines have different even-mode impedances.

In some embodiments, the method further includes providing input matching using the first pair of conductive lines, the second pair of conductive lines, and the transmission line.

In various embodiments, the method further includes providing output matching using the first pair of conductive lines, the second pair of conductive lines, and the transmission line.

In some embodiments, the method further includes providing a first port on an end of the first conductive line opposite the transmission line, providing a second port on an end of the second conductive line of the first pair of conductive lines, and providing a third port on an end of the fourth conductive line of the second pair of conductive lines.

According to a number of embodiments, the method further includes using the first port as an unbalanced terminal for a single-ended signal, using the second port as a positive terminal for a differential signal, and using the third port as a negative terminal for the differential signal.

In accordance with several embodiments, the method further includes using the first port to receive a single-ended signal from an amplifier.

According to various embodiments, the method further includes using the first port to provide a single-ended signal to an amplifier.

In accordance with a number of embodiments, the method further includes using the second port and the third port to receive a differential signal from an amplifier.

According to several embodiments, the method further includes using the second port and the third port provide a differential signal to an amplifier.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
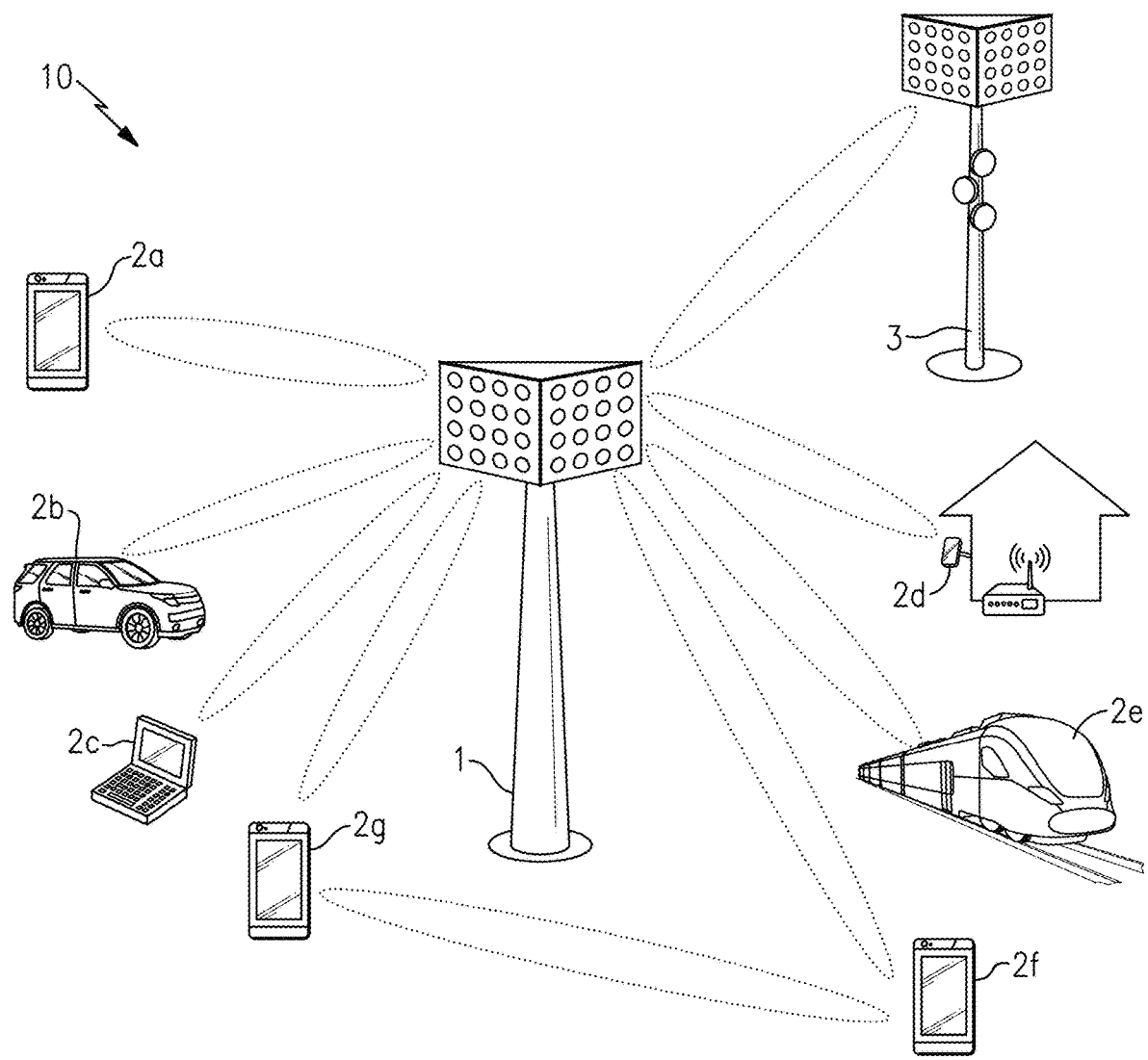
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
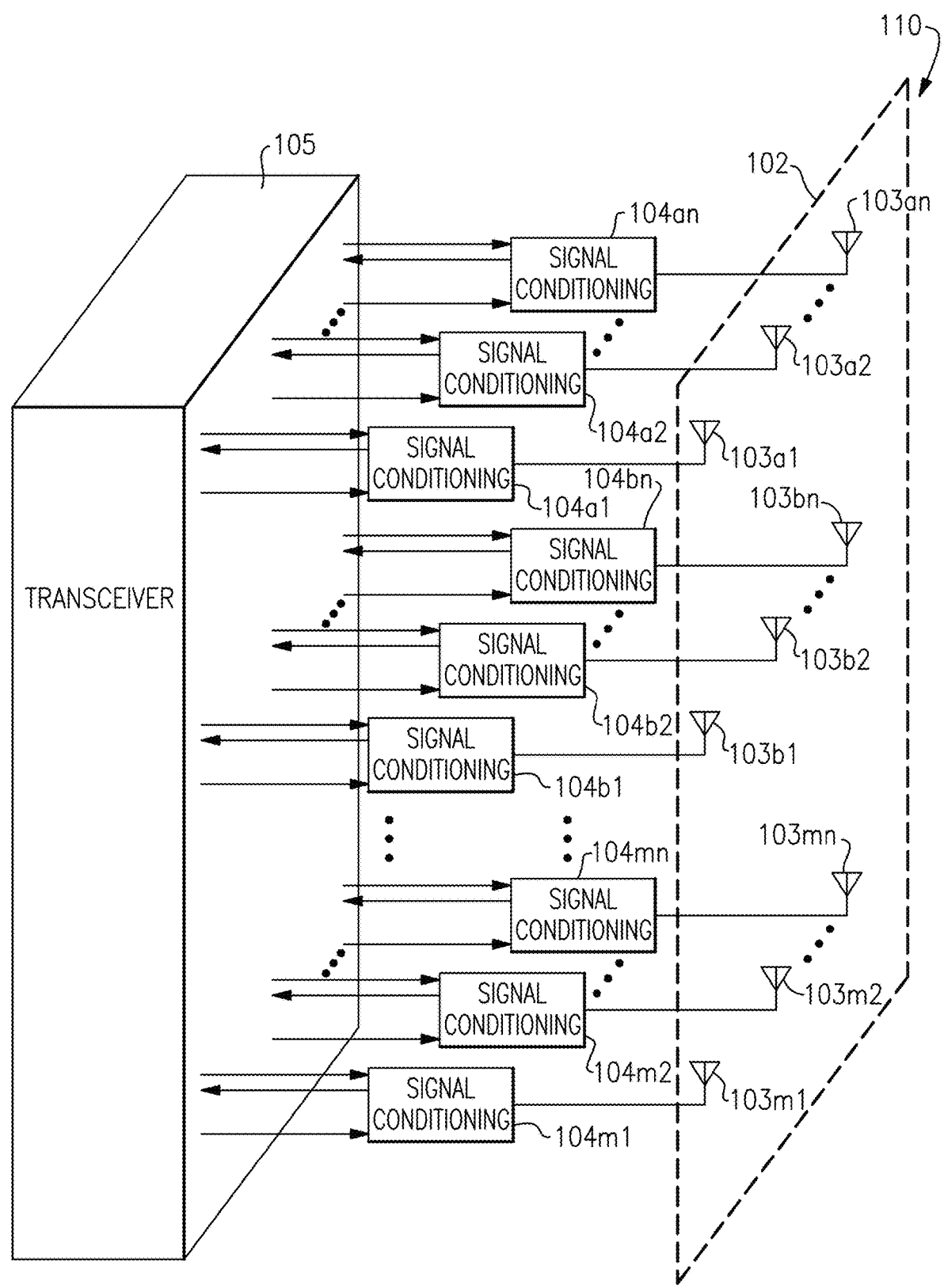
FIG. 2A is a schematic diagram of one embodiment of a communication system that operates with beamforming.

FIG. 2A is a schematic diagram of one embodiment of a communication system 110 that operates with beamforming. The communication system 110 includes a transceiver 105, signal conditioning circuits 104$a$1, 104$a$2 ... 104$an$, 104$b$1, 104$b$2 ... 104$bn$, 104$m$1, 104$m$2 ... 104$mn$, and an antenna array 102 that includes antenna elements 103$a$1, 103$a$2 ... 103$an$, 103$b$1, 103$b$2 ... 103$bn$, 103$m$1, 103$m$2 ... 103$mn$.

Communications systems that communicate using millimeter wave carriers, centimeter wave carriers, and/or other frequency carriers can employ an antenna array such as the antenna array 102 to provide beam formation and directivity for transmission and/or reception of signals.

For example, in the illustrated embodiment, the communication system 110 includes an array 102 of m×n antenna elements, each of which are coupled to a separate signal conditioning circuit, in this embodiment. As indicated by the ellipses, the communication system 110 can be implemented with any suitable number of antenna elements and signal conditioning circuits.

With respect to signal transmission, the signal conditioning circuits 104$a$1, 104$a$2 ... 104$an$, 104$b$1, 104$b$2 ... 104$bn$, 104$m$1, 104$m$2 ... 104$mn$ can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits 104$a$1, 104$a$2 ... 104$an$, 104$b$1, 104$b$2 ... 104$bn$, 104$m$1, 104$m$2 ... 104$mn$ process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits 104$a$1, 104$a$2 ... 104$an$, 104$b$1, 104$b$2 ... 104$bn$, 104$m$1, 104$m$2 ... 104$mn$ and processes signals received from the signal conditioning circuits.

As shown in FIG. 2A, the transceiver 105 generates control signals for the signal conditioning circuits 104$a$1, 104$a$2 ... 104$an$, 104$b$1, 104$b$2 ... 104$bn$, 104$m$1, 104$m$2 ... 104$mn$. The control signals can be used for a variety of functions, such as controlling the gain and phase of transmitted and/or received signals to control beamforming. For example, each of the signal conditioning circuits 104$a$1, 104$a$2 ... 104$an$, 104$b$1, 104$b$2 ... 104$bn$, 104$m$1, 104$m$2 ... 104$mn$ can include a phase shifter implemented in accordance with the teachings herein.

Figure 2B:
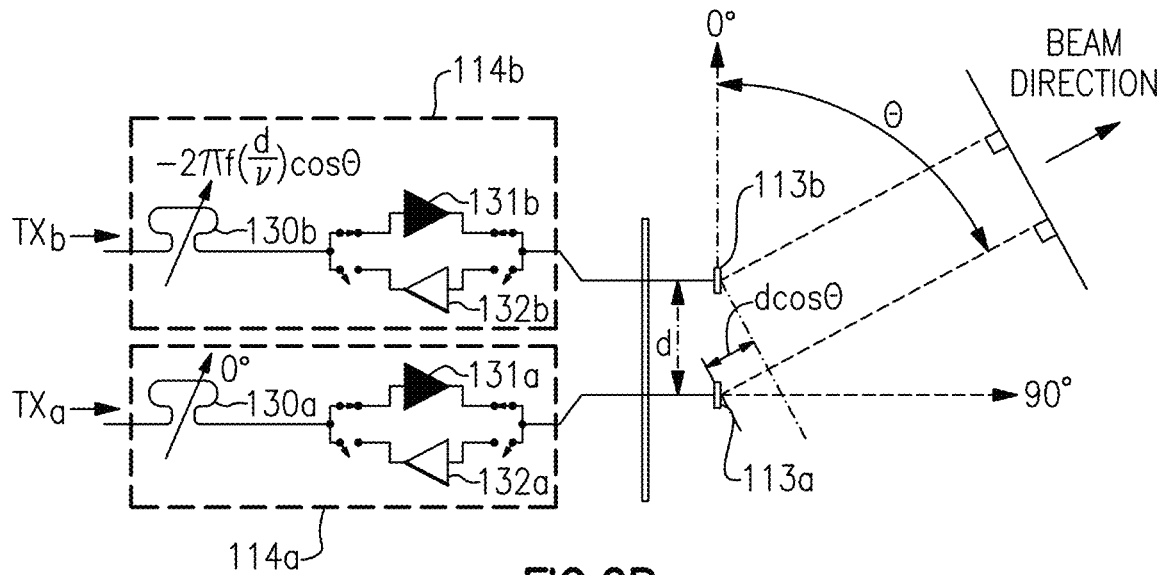
FIG. 2B is a schematic diagram of one embodiment of beamforming to provide a transmit beam.

FIG. 2B is a schematic diagram of one embodiment of beamforming to provide a transmit beam. FIG. 2B illustrates a portion of a communication system including a first signal conditioning circuit 114$a$, a second signal conditioning circuit 114$b$, a first antenna element 113$a$, and a second antenna element 113$b$.

Although illustrated as included two antenna elements and two signal conditioning circuits, a communication system can include additional antenna elements and/or signal conditioning circuits. For example, FIG. 2B illustrates one embodiment of a portion of the communication system 110 of FIG. 2A.

The first signal conditioning circuit 114$a$ includes a first phase shifter 130$a$, a first power amplifier 131$a$, a first low noise amplifier (LNA) 132$a$, and switches for controlling selection of the power amplifier 131$a$ or LNA 132$a$. Additionally, the second signal conditioning circuit 114$b$ includes a second phase shifter 130$b$, a second power amplifier 131$b$, a second LNA 132$b$, and switches for controlling selection of the power amplifier 131$b$ or LNA 132$b$. The first phase shifter 130$a$ and the second phase shifter 130$b$ can be implemented in accordance with any of the embodiments herein.

Although one embodiment of signal conditioning circuits is shown, other implementations of signal conditioning circuits are possible. For instance, in one example, a signal conditioning circuit includes one or more band filters, duplexers, diplexers, and/or other components.

In the illustrated embodiment, the first antenna element 113a and the second antenna element 113b are separated by a distance d. Additionally, FIG. 2B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about $-\pi\cos\theta$ radians to achieve a transmit beam angle θ.

Accordingly, the relative phase of the phase shifters 130a, 130b can be controlled to provide transmit beamforming. In certain implementations, a transceiver (for example, the transceiver 105 of FIG. 2A) controls phase values of one or more phase shifters to control beamforming.

Figure 2C:
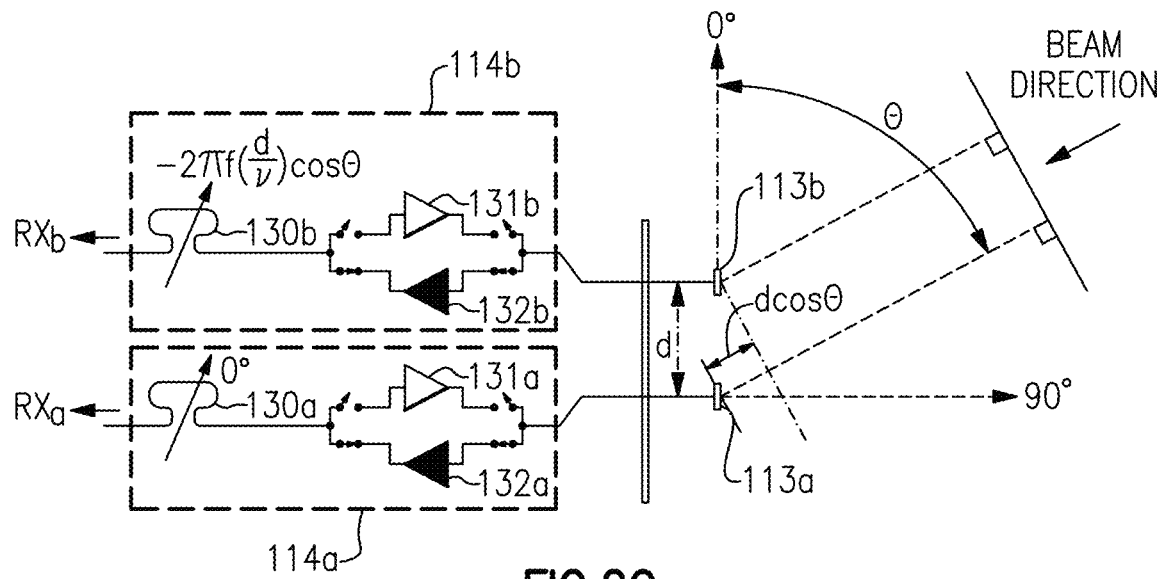
FIG. 2C is a schematic diagram of one embodiment of beamforming to provide a receive beam.

FIG. 2C is a schematic diagram of one embodiment of beamforming to provide a receive beam. FIG. 2C is similar to FIG. 2B, except that FIG. 2C illustrates beamforming in the context of a receive beam rather than a transmit beam.

As shown in FIG. 2C, a relative phase difference between the first phase shifter 130a and the second phase shifter 130b can be selected to about equal to $-2\pi f(d/v)\cos\theta$ radians to achieve a desired receive beam angle θ. In implementations in which the distance d corresponds to about ½λ the phase difference can be selected to about equal to $-\pi\cos\theta$ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Baluns with Integrated Matching Networks

Baluns are used in radio frequency (RF) systems to convert an unbalanced RF signal (also referred to as a single-ended RF signal) to a balanced RF signal (also referred to as a differential RF signal), or vice versa.

When designing an on-chip balun, a balun design can be simulated using an electromagnetic simulator (EM) and iteratively adjusted until performance specifications are met. Although such a trial and error approach can sometimes achieve a working balun, such a design process can be long, cumbersome, and the outcome may not necessarily be the best result in terms of area, loss, bandwidth, and/or balance. Moreover, input matching and output matching considerations can complicate the design process. For example, an explicit input matching network and/or an explicit output matching network are typically present in a balun design.

Baluns with integrated matching networks are provided herein. In certain embodiments, a balun structure includes a first pair of coupled lines, a second pair of coupled lines and a transmission line. Additionally, a first port of the balun is connected to a reference voltage (for instance, ground) by way of a series combination of a first line of the first pair of coupled lines, the transmission line, and a first line of the second pair of coupled lines. Furthermore, a second port of the balun is connected to the reference voltage by way of a second line of the first pair of coupled lines, while a third port of the balun is connected to the reference voltage by way of a second line of the second pair of coupled lines. The first port serves as an unbalanced terminal for an unbalanced RF signal, while the second port and the third port serve as positive and negative terminals for a balanced RF signal.

The even mode impedance, odd mode impedance, and length of the first pair of coupled lines is separately adjustable during design from the even mode impedance, odd mode impedance, and length of the second pair of coupled lines. Furthermore, the impedance and length of the transmission line can also be separately adjusted during design. Such parameters can be tuned to provide a methodology for on-die balun design with lower loss, smaller area, wider bandwidth, and/or improved balance. Since the number of design parameters are small, the balun can be easily modeled and designed very quickly.

Moreover, such parameter tuning can be used to achieve desired input matching and output matching. Thus, the baluns herein can operate with integrated input matching networks and/or integrated output matching networks. Such integration reduces loss and/or provides a more compact chip layout.

The baluns can be further tuned with one or more additional components, such as a shunt capacitor across the second port and third port, a series capacitor for the first port, and/or a shunt capacitor for the first port.

The baluns herein can be used in a wide variety of applications, including for providing single-ended to differential signal conversion (or vice versa) at the input and/or output of an amplifier, such as a power amplifier (PA), low noise amplifier (LNA), and/or variable gain amplifier (VGA). Furthermore, the baluns can be fabricated on-chip using a variety of chip manufacturing processes including, but not limited to, silicon on insulator (SOI) processes.

In certain implementations herein, a balun is configured to handle an RF signal in frequency range 2 (FR2) of 5G, for instance, 24.25 GHz to 52.6 GHz. However, the baluns herein can handle other RF signal frequencies.

Figure 3A:
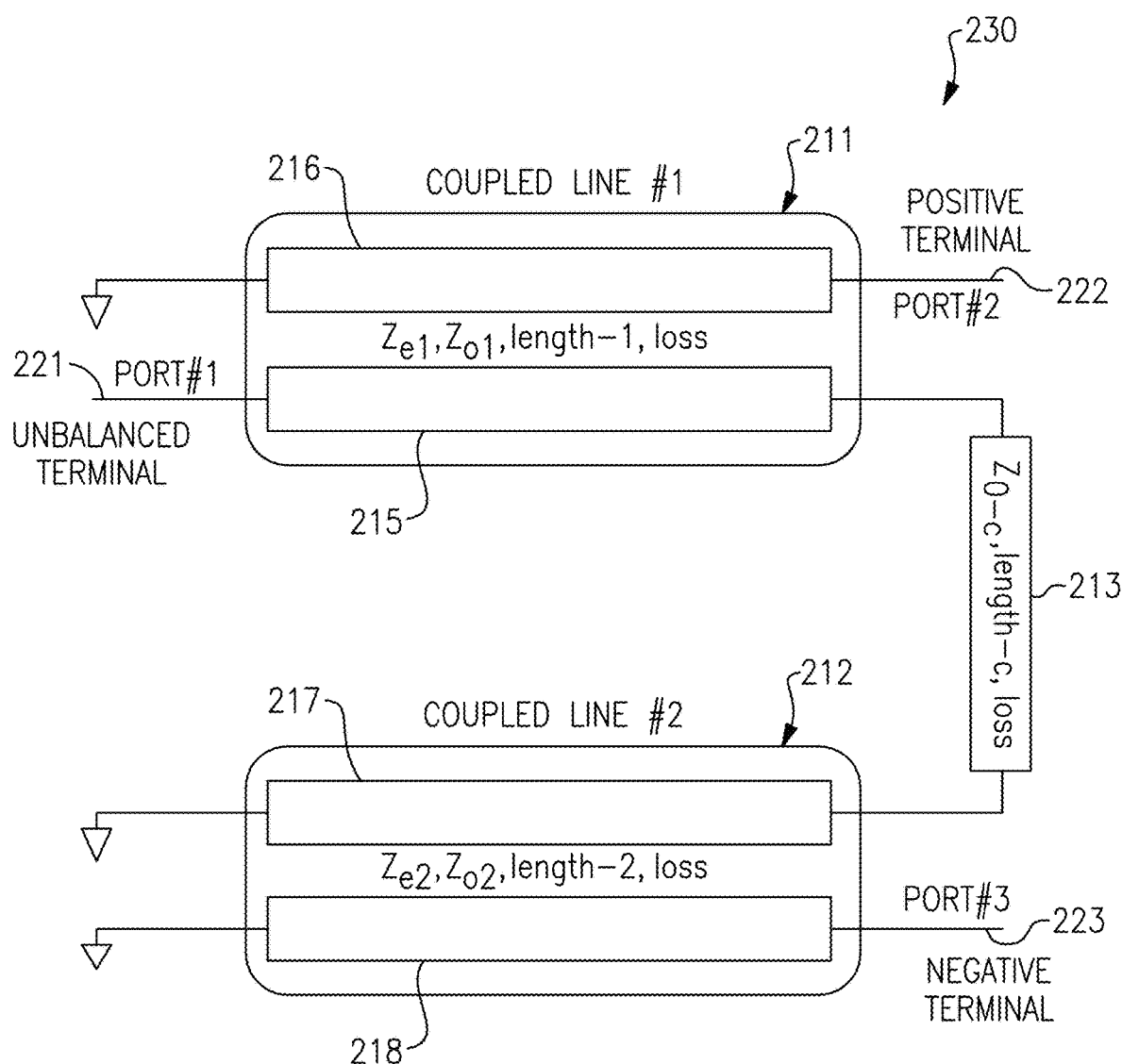
FIG. 3A is a schematic diagram of a balun with an integrated matching network according to one embodiment.

FIG. 3A is a schematic diagram of a balun 230 with an integrated matching network according to one embodiment. The balun 230 includes a first pair of coupled lines 211, a second pair of coupled lines 212, a transmission line 213 (also referred to as a transmission line section), a first port 221, a second port 222, and a third port 223. The first port 221 serves as an unbalanced terminal for an unbalanced RF signal, the second port 222 serves as a positive terminal for a balanced RF signal, and the third port 223 serves as a negative terminal for a balanced RF signal.

As shown in FIG. 3A, the first pair of coupled lines 211 includes a first line 215 and a second line 216 that are electromagnetically coupled (for example, inductively coupled by close placement of the conductive lines) to one another. Additionally, the second pair of coupled lines 212 includes a first line 217 and a second line 218 that are electromagnetically coupled to one another. The first port 221 is connected to a first end of the first line 215, while a second end of the first line 215 is connected to a first end of the transmission line 213. Additionally, a first end of the second line 216 is connected to a reference voltage (ground, in this example), while a second end of the second line 216 is connected to the second port 222. Furthermore, a first end of the first coupled line 217 is connected to a second end of the transmission line 213, while a second end of the first line 217 is connected to the reference voltage. Additionally, a first end of the second couple line 218 is connected to the third port 223, while a second end of the second line 218 is connected to the reference voltage.

Accordingly, the first port 221 is connected to the reference voltage by way of series combination of the first line 215 of the first pair of coupled lines 211, the transmission line 213, and the first line 217 of the second pair of coupled lines 212. Furthermore, the second port 222 is connected to the reference voltage by way of the second line 216 of the first pair of coupled lines 211, while the third port 223 is connected to the reference voltage by way of the second line 218 of the second pair of coupled lines 212.

The even mode impedance, odd mode impedance, and length ($Z_{e1}$, $Z_{o1}$, length-1) of the first pair of coupled lines 211 is separately adjustable during design from the even mode impedance, odd mode impedance, and length ($Z_{e2}$, $Z_{o2}$, length-2) of the second pair of coupled lines 212. Furthermore, the impedance and length ($Z_{O-e}$, length-c) of the transmission line 213 can also be separately adjusted during design.

Accordingly, the balun 230 can be designed very quickly with a desired differential impedance at a certain frequency and bandwidth.

The balun 230 can be designed in a variety of ways. In one embodiment, the balun is initially designed with identical pairs of coupled lines. If EM simulation indicates that there is imbalance between the positive and negative terminals, balance can be improved by changing one of the coupled line parameters ($Z_e$, $Z_o$, length). For example, if $|S_{31}|<|S_{21}|$, then by increasing the coupling on the second pair of coupled lines 212 balance gets improved. In another example, if phase($S_{31}$)-phase($S_{21}$) is less than 180 degrees, then by increasing length-2 of the second pair of coupled lines 212 balance can get improved.

Figure 3B:
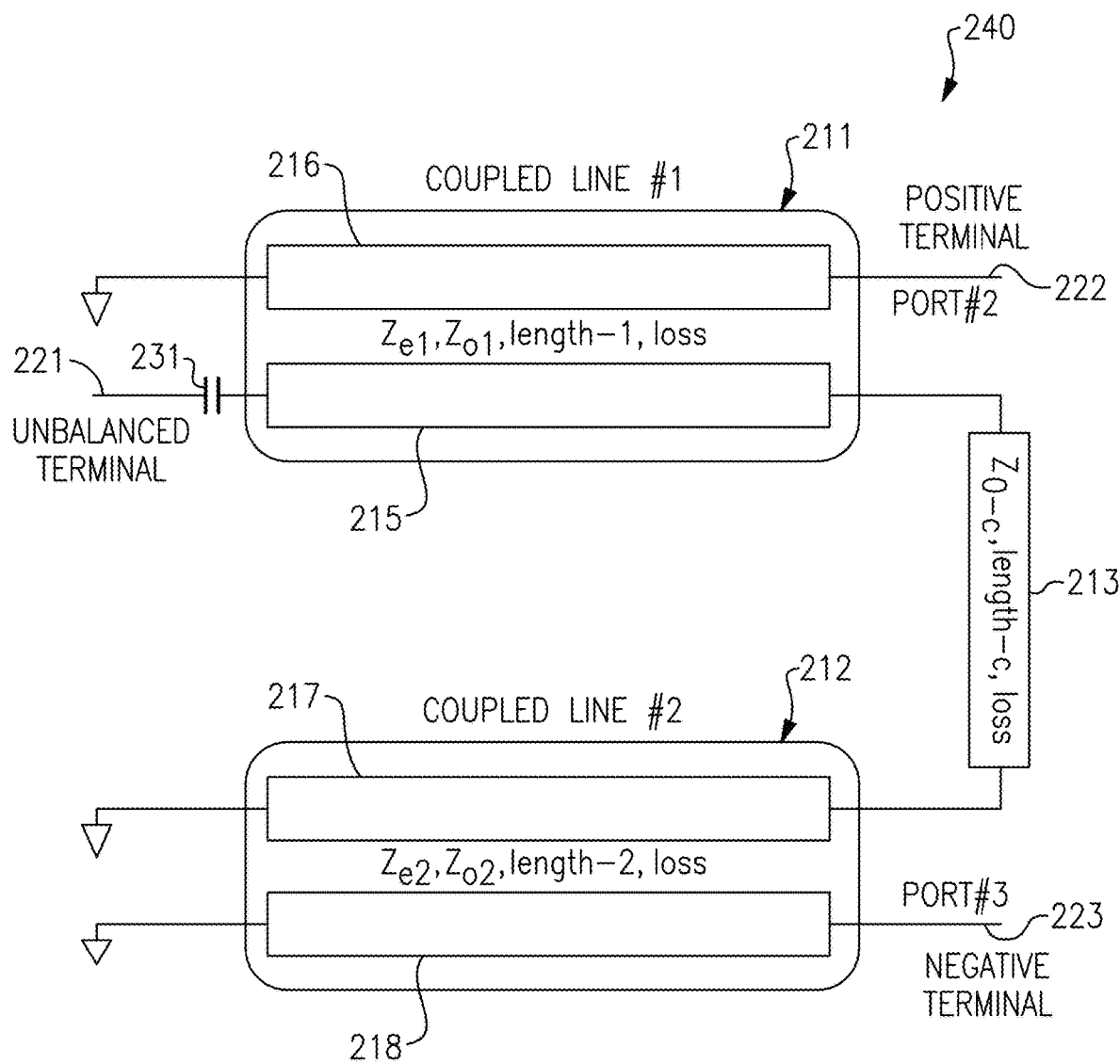
FIG. 3B is a schematic diagram of a balun with an integrated matching network according to another embodiment.

FIG. 3B is a schematic diagram of a balun 240 with an integrated matching network according to another embodiment.

The balun 240 of FIG. 3B is similar to the balun 230 of FIG. 3A, except that the balun 240 further includes a series capacitor 231 connected between the first port 221 and the first line 215 of the first pair of coupled lines 211.

Figure 3C:
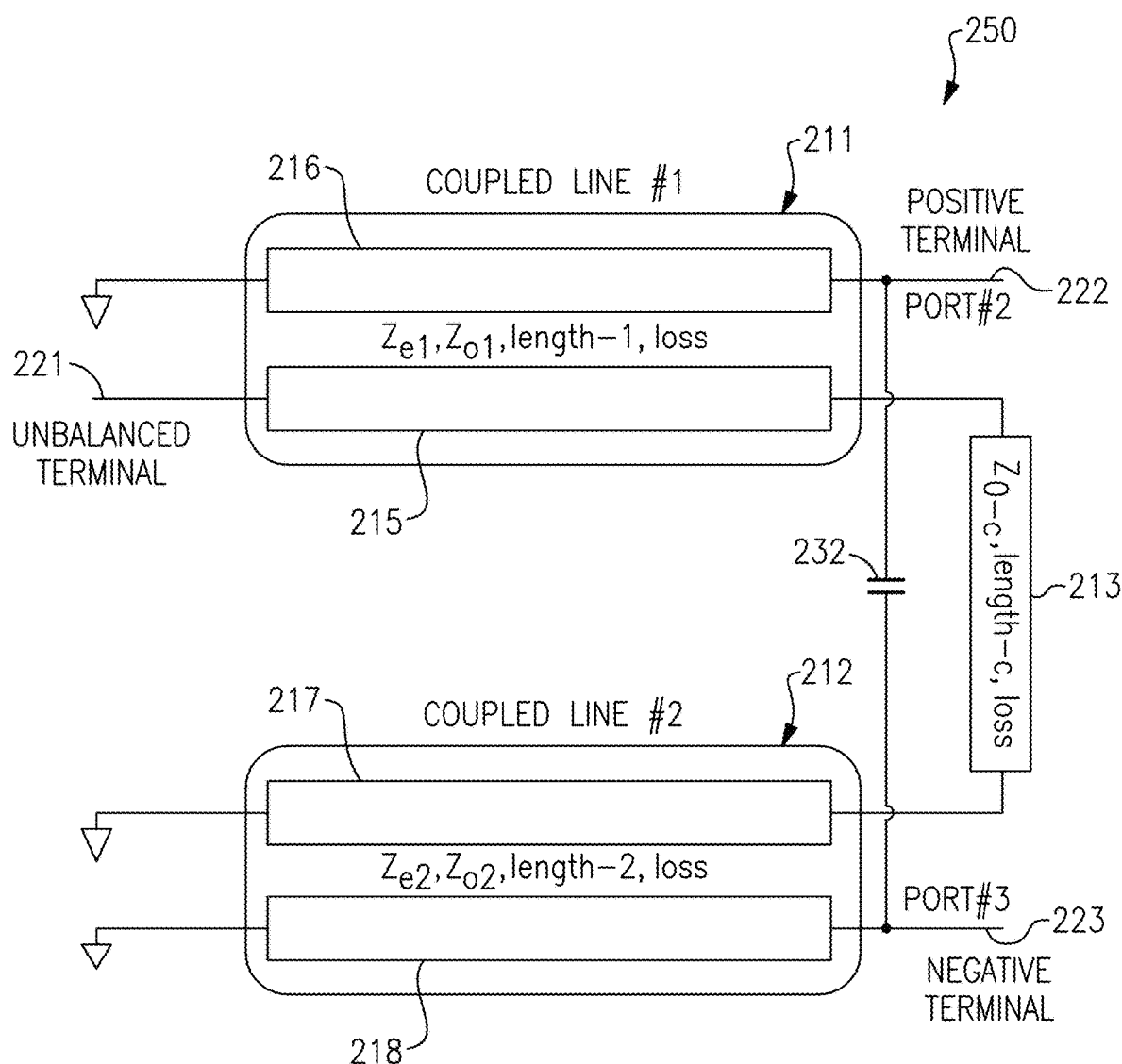
FIG. 3C is a schematic diagram of a balun with an integrated matching network according to another embodiment.

FIG. 3C is a schematic diagram of a balun 250 with an integrated matching network according to another embodiment.

The balun 250 of FIG. 3C is similar to the balun 230 of FIG. 3A, except that the balun 250 further includes a shunt capacitor 232 connected between the second port 222 and the third port 223.

Figure 3D:
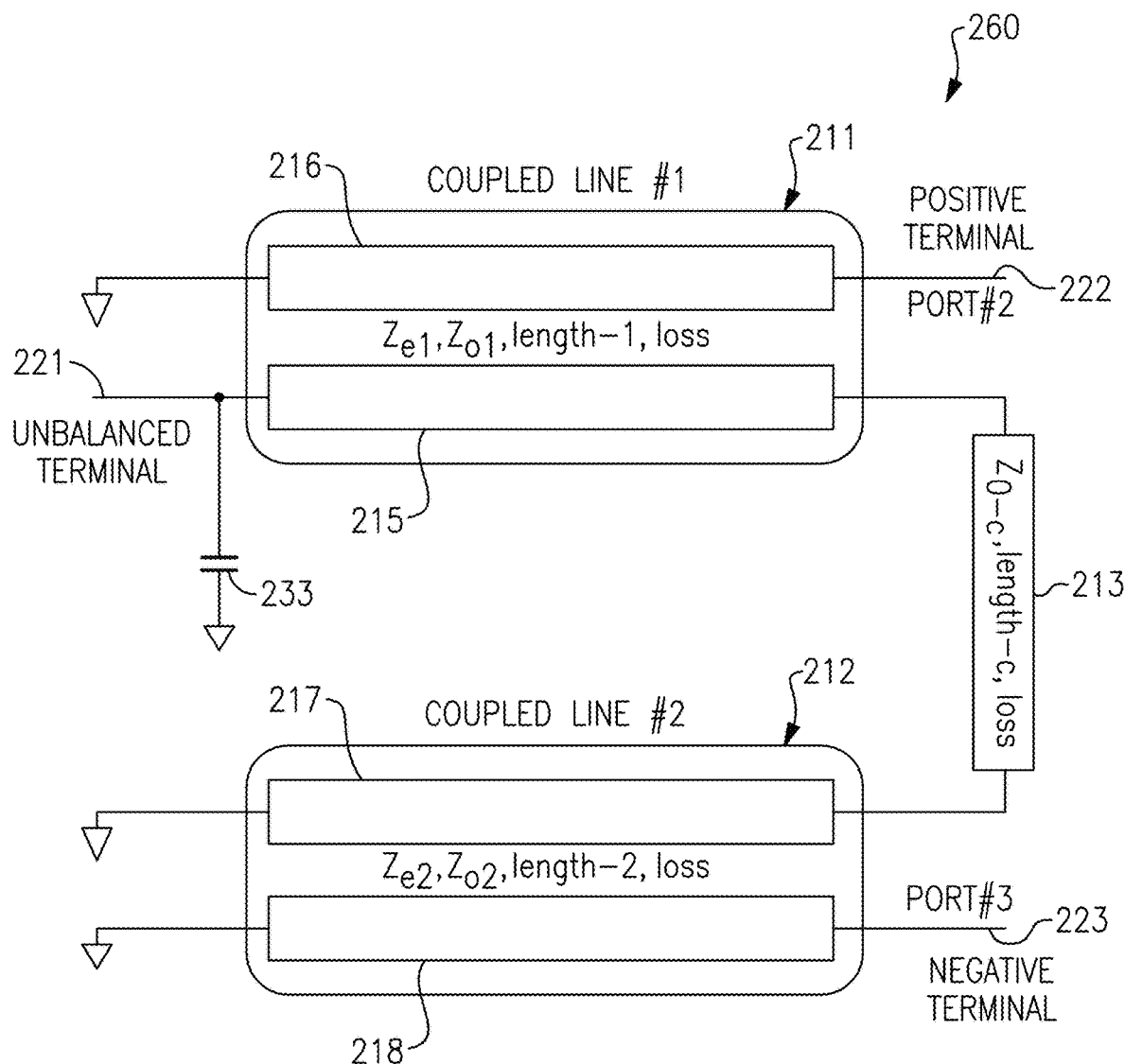
FIG. 3D is a schematic diagram of a balun with an integrated matching network according to another embodiment.

FIG. 3D is a schematic diagram of a balun 260 with an integrated matching network according to another embodiment.

The balun 260 of FIG. 3D is similar to the balun 230 of FIG. 3A, except that the balun 260 further includes a shunt capacitor 233 connected between the first port 221 and the reference voltage.

Figure 3E:
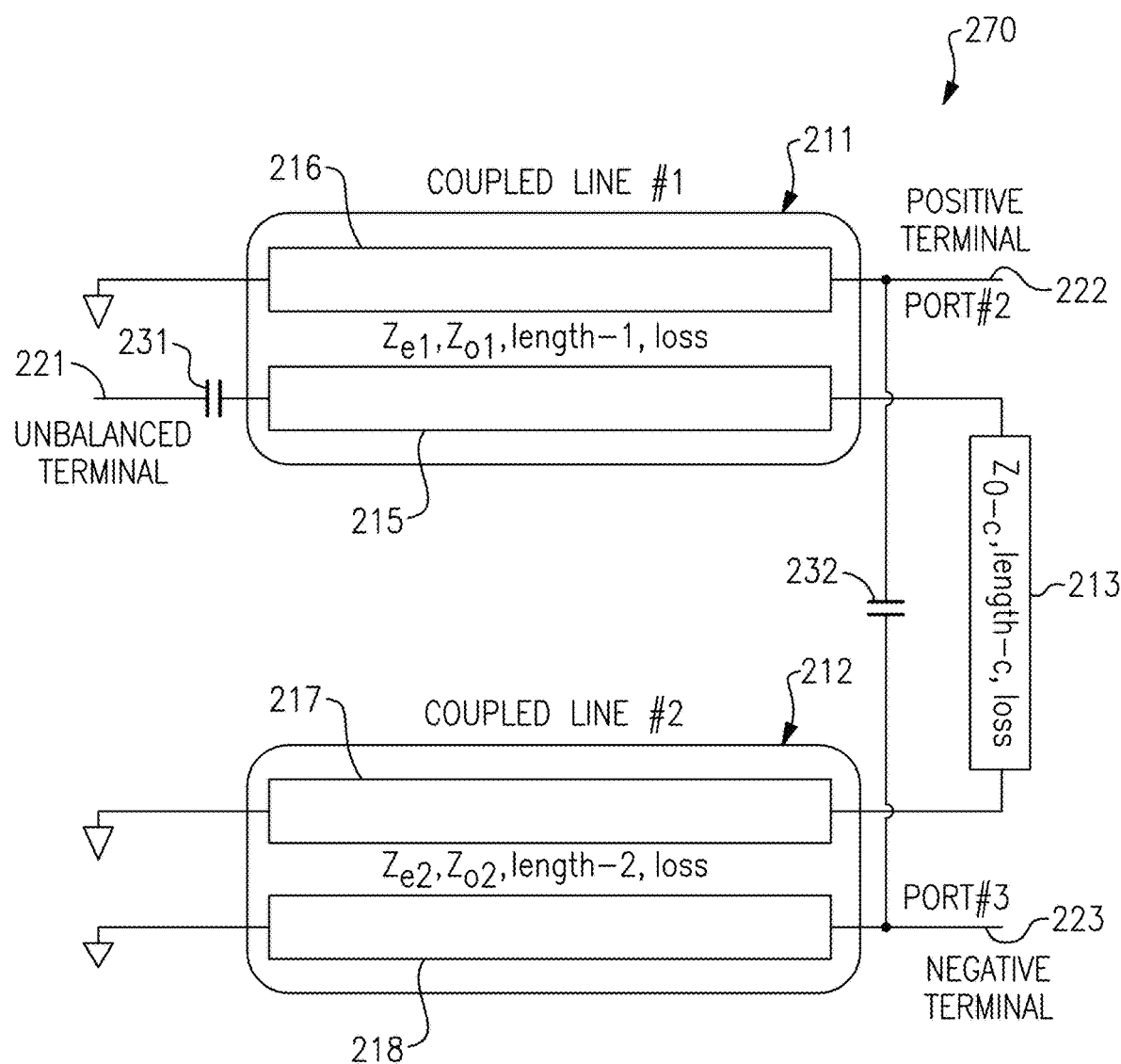
FIG. 3E is a schematic diagram of a balun with an integrated matching network according to another embodiment.

FIG. 3E is a schematic diagram of a balun 270 with an integrated matching network according to another embodiment.

The balun 270 of FIG. 3E is similar to the balun 230 of FIG. 3A, except that the balun 270 further includes a series capacitor 231 connected between the first port 221 and the first line 215 of the first pair of coupled lines 211, and a shunt capacitor 232 connected between the second port 222 and the third port 223.

With reference to FIGS. 3B to 3E, one or more additional components can be added to a balun structure for enhanced performance, such as improved matching and/or wider bandwidth.

Although various examples of components or combination of components have been depicted, a wide variety of component(s) can be added to the baluns herein for providing performance modifications and/or enhancements. Thus, although four examples of additional components have been depicted in FIGS. 3B to 3E, other examples are possible.

Figure 4:
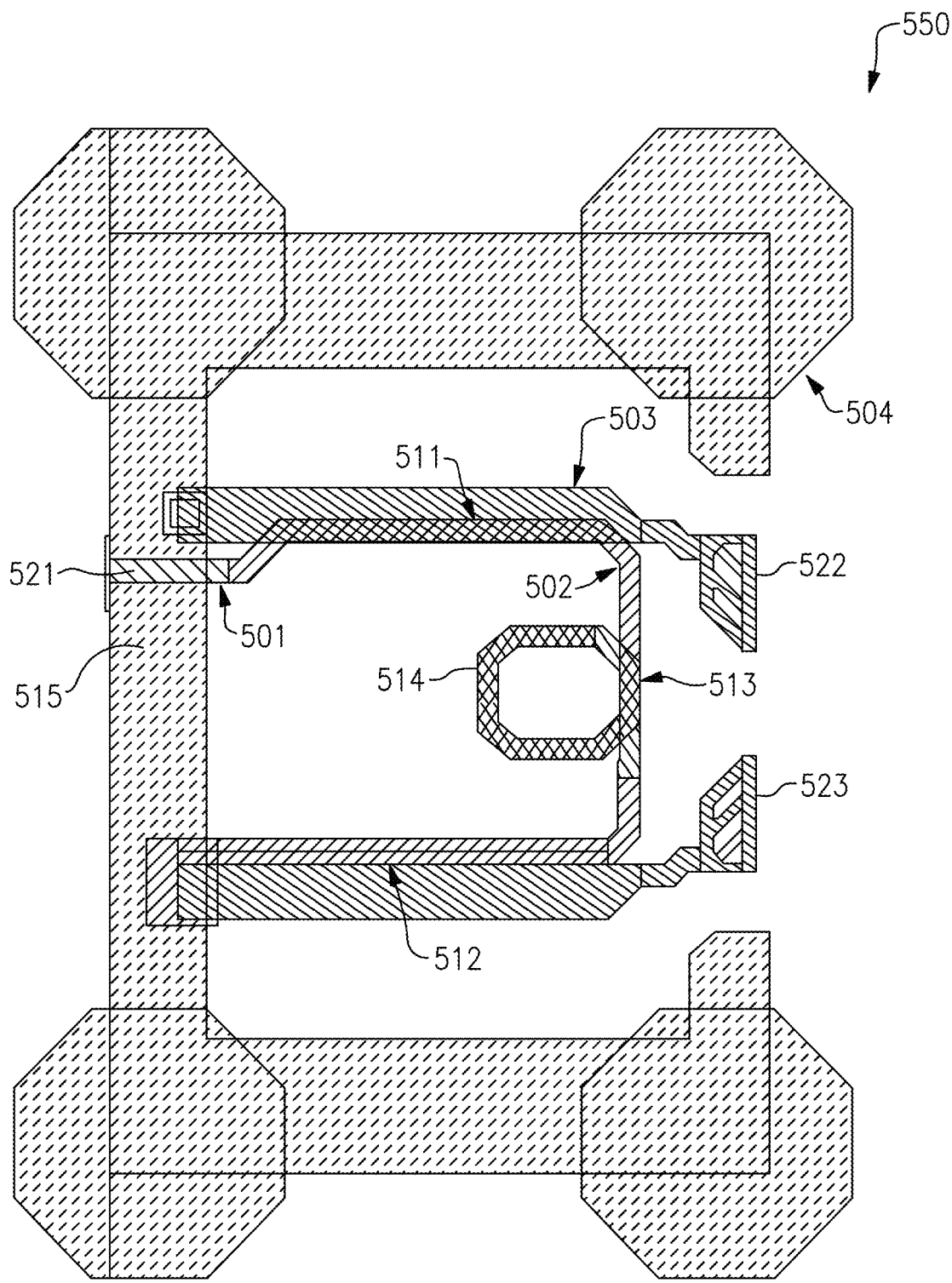
FIG. 4 is a schematic diagram of a metallization layout for a balun with an integrated matching network according to another embodiment.

FIG. 4 is a schematic diagram of a metallization layout for a balun 550 with an integrated matching network according to another embodiment. The metallization layout can be implemented on a semiconductor die including a first metal layer 501, a second metal layer 502, a third metal layer 503, and a fourth metal layer 504.

The balun 550 includes a first pair of coupled lines 511, a second pair of coupled lines 512, a transmission line 513, a first port 521, a second port 522, a third port 523, and a ground network 515.

In the illustrated embodiment, the coupled lines are vertically coupled, for instance, using vertical metal lines on adjacent metal layers or with one or more intervening metal layers omitted. In other implementations, horizontal coupling is used (for instance, using spaced apart metal conductors on a common metal layer).

The transmission line section 513 includes a spiral or coil 514, in this embodiment. By implementing the transmission line section 513 in this manner, a more compact layout is achieved.

Figure 5:
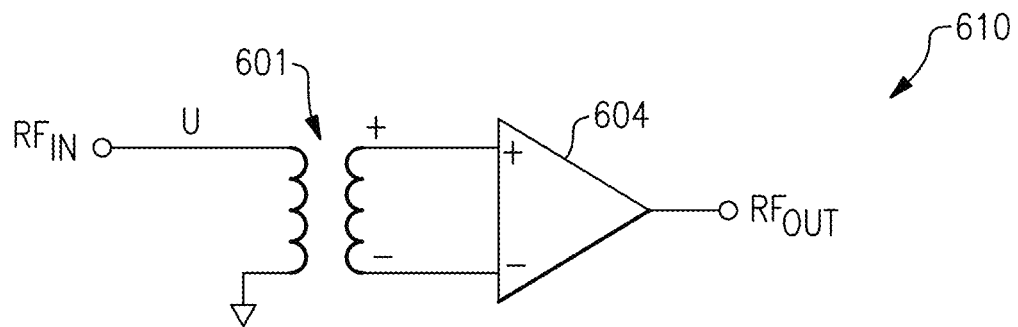
FIG. 5 is a schematic diagram of a radio frequency (RF) amplification system according to one embodiment.

FIG. 5 is a schematic diagram of a radio frequency (RF) amplification system 510 according to one embodiment. The RF amplification system 510 incudes a cascade of an input balun 601 and an RF amplifier 604.

In the illustrated embodiment, the input balun 601 converts a single-ended RF input signal $RF_{IN}$ (or unbalanced signal U) to a differential RF input signal. Additionally, the RF amplifier 604 amplifies the differential RF input signal to generate an RF output signal $RF_{OUT}$, which can be single-ended as shown or differential.

Figure 6:
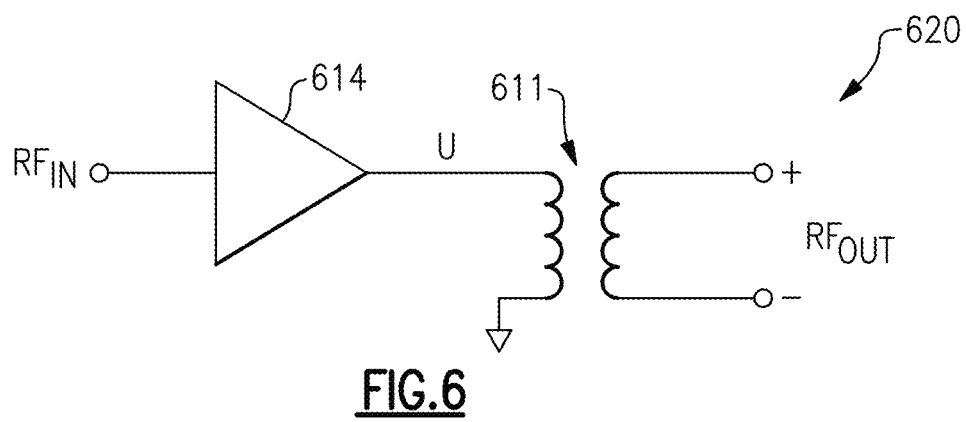
FIG. 6 is a schematic diagram of an RF amplification system according to another embodiment.

FIG. 6 is a schematic diagram of an RF amplification system 620 according to another embodiment. The RF amplification system 620 incudes a cascade of an RF amplifier 614 and an output balun 611.

In the illustrated embodiment, the RF amplifier 614 amplifies an RF input signal $RF_{IN}$, which can be singled ended as shown or differential. The RF amplifier 614 provides a single-ended RF output signal to the output balun 611, which converts the single-ended RF output signal to a differential RF output signal $RF_{OUT}$.

Figure 7:
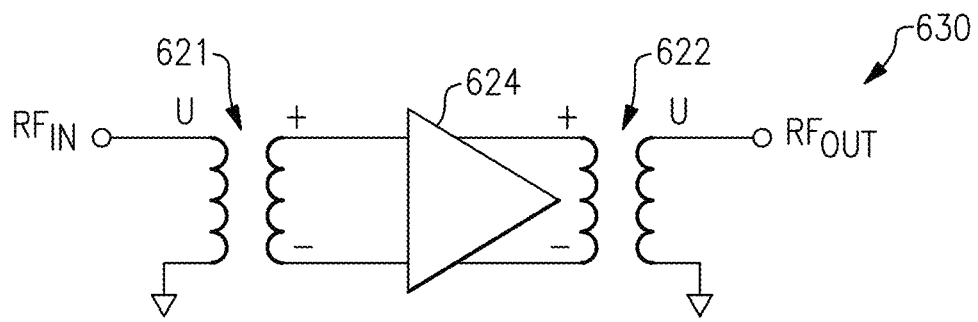
FIG. 7 is a schematic diagram of an RF amplification system according to another embodiment.

FIG. 7 is a schematic diagram of an RF amplification system 630 according to another embodiment. The RF amplification system 630 incudes a cascade of an input balun 621, an RF amplifier 624, and an output balun 622.

In the illustrated embodiment, the input balun 621 converts a single-ended RF input signal $RF_{IN}$ to a differential RF input signal. Additionally, the RF amplifier 624 amplifies the differential RF input signal to generate a differential RF output signal. Furthermore, the output balun 622 converts the differential RF output signal to a single-ended RF output signal $RF_{OUT}$.

Any of the baluns herein can be implemented in the use cases of FIGS. 5 to 7. Although example use cases of baluns have been depicted, the baluns herein can be used in other configurations of electronic systems.

Figure 8:
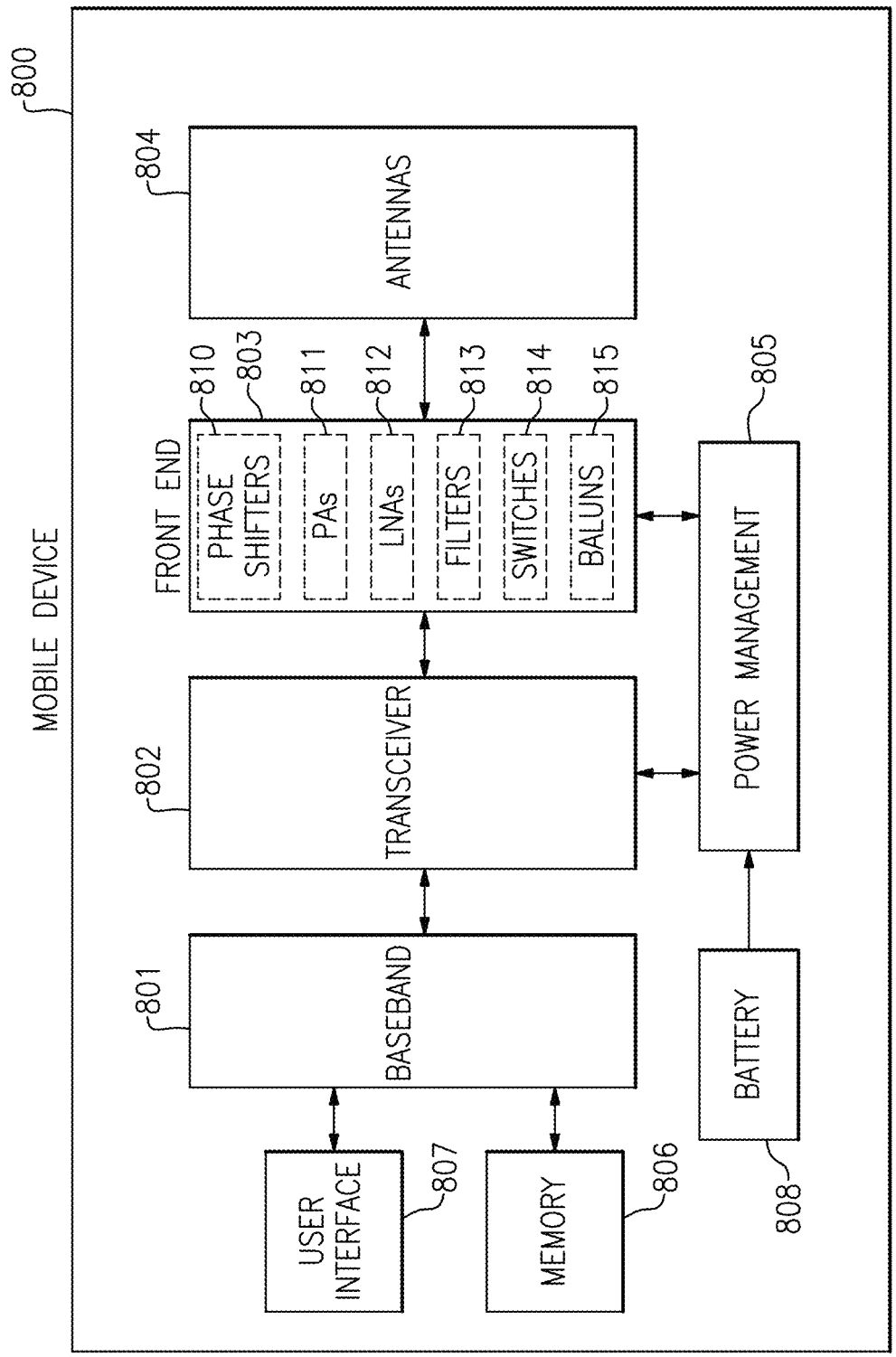
FIG. 8 is a schematic diagram of one embodiment of a mobile device.

FIG. 8 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 8 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes one or more phase shifters 810, power amplifiers (PAs) 811, low noise amplifiers (LNAs) 812, filters 813, switches 814, and baluns 815.

Moreover, the one or more baluns 815 can be used in combination with any of the components to provide single-ended to differential signal conversion, or vice versa. Such balun(s) can be implemented in accordance with any of the embodiments herein.

The front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The mobile device 800 operates with beamforming. For example, the front end system 803 includes phase shifters 810 having variable phase controlled by the transceiver 802. In certain implementations, the transceiver 802 controls the phase of the phase shifters 810 based on data received from the processor 801.

The phase shifters 810 are controlled to provide beam formation and directivity for transmission and/or reception of signals using the antennas 804. For example, in the context of signal transmission, the phases of the transmit signals provided to an antenna array used for transmission are controlled such that radiated signals combine using constructive and destructive interference to generate an aggregate transmit signal exhibiting beam-like qualities with more signal strength propagating in a given direction. In the context of signal reception, the phases are controlled such that more signal energy is received when the signal is arriving to the antenna array from a particular direction.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 8, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 8, the power management system 805 receives a battery voltage from the battery 808. The battery 808 can be any suitable battery for use in the mobile device 800, including, for example, a lithium-ion battery.

Applications

The principles and advantages of the embodiments described herein can be used for a wide variety of applications.

For example, baluns can be included in various electronic devices, including, but not limited to consumer electronic products, parts of the consumer electronic products, electronic test equipment, etc. Example electronic devices include, but are not limited to, a base station, a wireless network access point, a mobile phone (for instance, a smartphone), a tablet, a television, a computer monitor, a computer, a hand-held computer, a personal digital assistant (PDA), a microwave, a refrigerator, an automobile, a stereo system, a disc player, a digital camera, a portable memory chip, a washer, a dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A balun comprising:
   a first pair of coupled lines including a first conductive line and a second conductive line;
   a second pair of coupled lines including a third conductive line and a fourth conductive line, the first pair of coupled lines and the second pair of coupled lines having different lengths, different odd-mode impedances, and different even-mode impedances; and
   a transmission line connecting the first conductive line of the first pair of coupled lines to the third conductive line of the second pair of coupled lines.

2. The balun of claim 1 wherein the transmission line includes a coil.

3. The balun of claim 1 further comprising a first port connected to an end of the first conductive line opposite the transmission line, a second port connected to the second conductive line of the first pair of coupled lines, and a third port connected to the fourth conductive line of the second pair of coupled lines.

4. The balun of claim 3 wherein the first port is as an unbalanced terminal for a single-ended signal, the second port is as a positive terminal for a differential signal, and the third port is as a negative terminal for the differential signal.

5. The balun of claim 3 wherein an end of the third conductive line opposite the transmission line is connected to a reference voltage.

6. The balun of claim 3 wherein an end of the second conductive line opposite the second port is connected to a reference voltage.

7. The balun of claim 3 wherein an end of the fourth conductive line opposite the third port is connected to a reference voltage.

8. A wireless device comprising:
   a transceiver; and
   a front-end system coupled to the transceiver, the front-end system including a balun that includes a first pair of coupled lines including a first conductive line and a second conductive line, a second pair of coupled lines including a third conductive line and a fourth conductive line, and a transmission line connecting the first conductive line of the first pair of coupled lines to the third conductive line of the second pair of coupled lines, the first pair of coupled lines and the second pair of coupled lines having different lengths, different odd-mode impedances, and different even-mode impedances.

9. The wireless device of claim 8 further comprising an amplifier, the first pair of coupled lines, the second pair of coupled lines, and the transmission line operable to provide input matching to the amplifier.

10. The wireless device of claim 8 further comprising an amplifier, the first pair of coupled lines, the second pair of coupled lines, and the transmission line operable to provide output matching to the amplifier.

11. The wireless device of claim 8 wherein the transmission line includes a coil.

12. The wireless device of claim 8 wherein the balun further includes a first port connected to an end of the first conductive line opposite the transmission line, a second port connected to the second conductive line of the first pair of coupled lines, and a third port connected to the fourth conductive line of the second pair of coupled lines.

13. The wireless device of claim 12 the front-end system further includes an amplifier configured to provide a single-ended signal to the first port.

14. The wireless device of claim 12 wherein the front-end front end system further includes an amplifier configured to provide a differential signal to the second port and the third port.

15. A method of signal conversion in a balun, the method comprising:
providing coupling between a first conductive line and a second conductive line of a first pair of coupled lines;
providing coupling between a third conductive line and a fourth conductive line of a second pair of coupled lines, the first pair of coupled lines and the second pair of coupled lines having different lengths, different odd-mode impedances, and different even-mode impedances; and
providing a signal path through a transmission line from the first conductive line of the first pair of coupled lines to the third conductive line of the second pair of coupled lines.

16. The method of claim 15 further comprising providing input matching using the first pair of coupled lines, the second pair of coupled lines, and the transmission line.

17. The method of claim 15 further comprising providing output matching using the first pair of coupled lines, the second pair of coupled lines, and the transmission line.

18. The method of claim 15 wherein the balun further includes a first port connected to an end of the first conductive line opposite the transmission line, a second port connected to the second conductive line of the first pair of coupled lines, and a third port connected to the fourth conductive line of the second pair of coupled lines.

19. The method of claim 18 further comprising providing a single-ended signal to the first port using an amplifier.

20. The method of claim 18 further comprising providing a differential signal to the second port and the third port using an amplifier.

* * * * *